United States Patent [19]

Le

[11] Patent Number: 5,679,923

[45] Date of Patent: Oct. 21, 1997

[54] SHIELDING PANEL

[75] Inventor: Bao Gia Le, Orange, Calif.

[73] Assignee: Ast Research, Inc., Irvine, Calif.

[21] Appl. No.: 391,700

[22] Filed: Feb. 17, 1995

[51] Int. Cl.$^6$ ............................ H05K 9/00; E06B 7/16; E06B 3/00

[52] U.S. Cl. .................. 174/35 R; 361/800; 24/293; 24/294; 49/489.1; 49/503

[58] Field of Search ............................. 49/492.1, 489.1, 49/503, 483.1, 495.1, 496.1; 174/35 GC, 35 C, 35 R; 361/638, 649, 769, 787, 800, 816, 818; 257/659; 24/293–295; 439/816–826, 907–908, 759–761

[56] References Cited

U.S. PATENT DOCUMENTS

| | | | |
|---|---|---|---|
| 5,067,041 | 11/1991 | Cooke et al. | 361/394 |
| 5,381,314 | 1/1995 | Rudy, Jr. et al. | 361/712 |
| 5,463,532 | 10/1995 | Petitpierre et al. | 361/800 |

Primary Examiner—Bot L. Ledynh

Attorney, Agent, or Firm—Knobbe, Martens, Olson & Bear LLP

[57] ABSTRACT

A shielding panel for shielding circuit card slots on a computer chassis, and particularly a shielding panel for use with printed circuit board brackets and/or blank brackets to shield circuit card slots provides an arrangement for reducing the leakage of electromagnetic waves and/or radio frequency waves through a computer chassis by providing protrusions around circuit card slots in the slot frame. The design of the present shielding panel includes a tab which wraps around an edge of the circuit card slot to help place and hold the shielding panel in position while substantially eliminating the potential interference between neighboring panels and/or panels and neighboring slots and inhibits the formation of a gap between the shielding panel and the computer chassis slot frame, therefore, substantially eliminating the chance of a bracket tip catching in such a gap. The present shielding panel also provides protrusions which are bent such that they extend above the surface of the shielding panel but the ends of which extend below the surface of the shielding panel or at least close enough to the surface of the shielding panel to thereby substantially eliminate the chance of a bracket snagging on the protrusions.

7 Claims, 9 Drawing Sheets

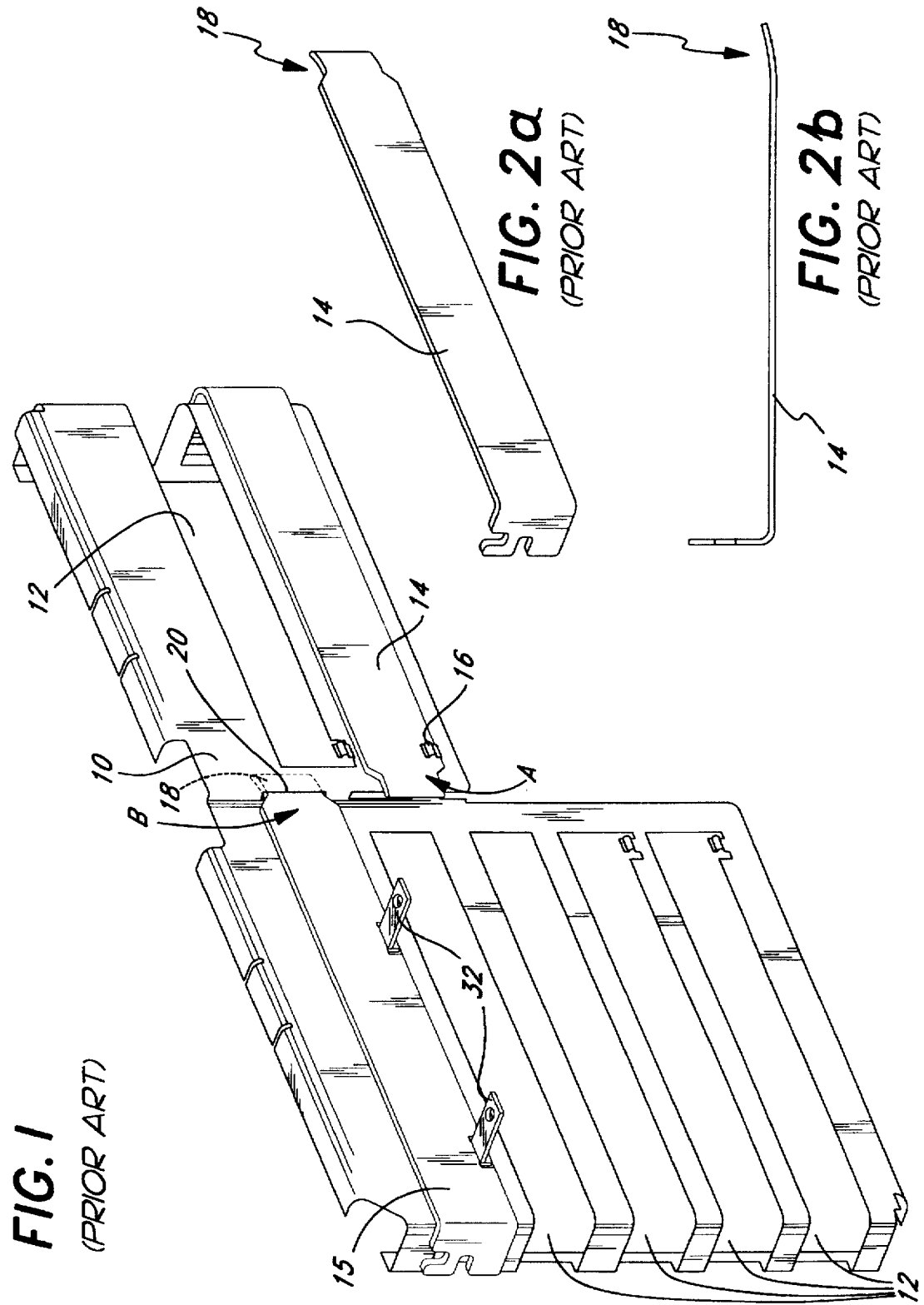

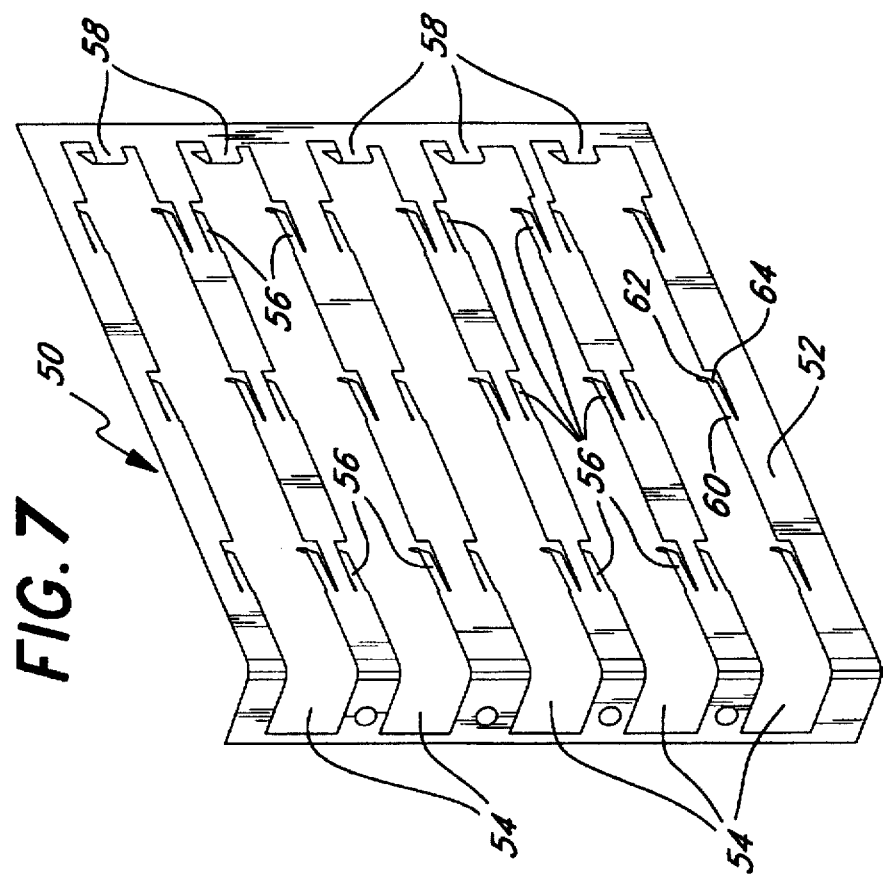
FIG. 7
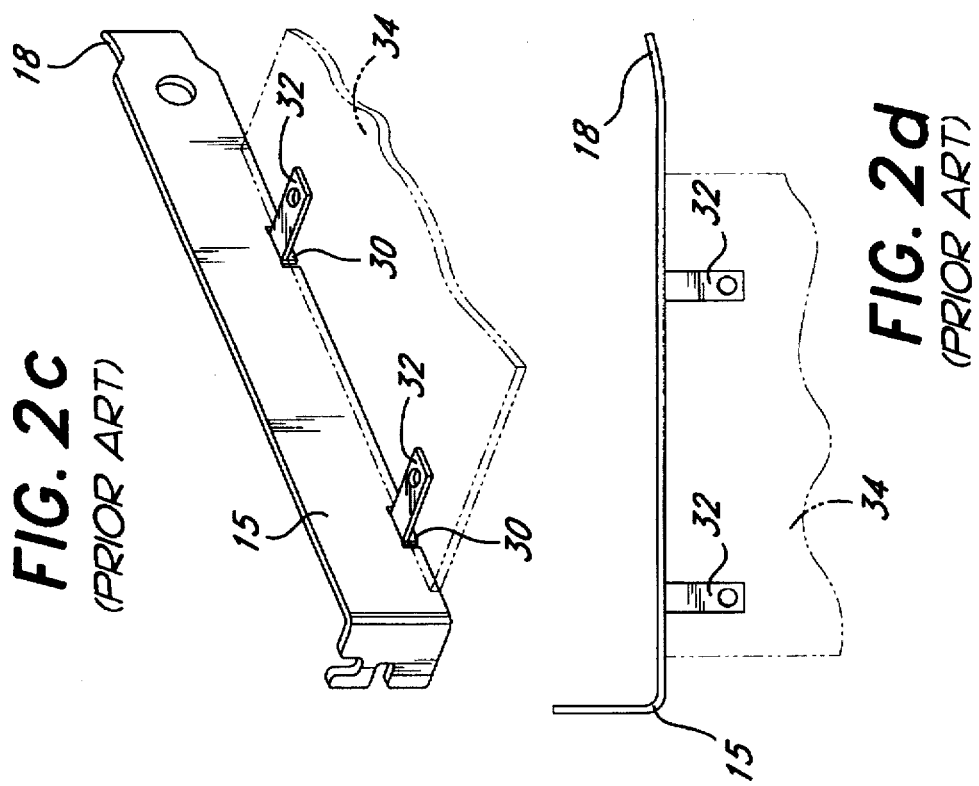
FIG. 2c (PRIOR ART)
FIG. 2d (PRIOR ART)

SHIELDING PANEL

FIELD OF INVENTION

The present invention relates to a shielding panel for shielding circuit card slots on a computer chassis, particularly a shielding panel for use with printed circuit board brackets and/or blank brackets to shield circuit card slots to reduce the leakage of electromagnetic waves and/or radio frequency waves through a computer chassis.

BACKGROUND

Computer systems are manufactured with expansion slots to allow peripheral devices to be added to the systems. Peripheral devices may be added to a computer system by connecting an appropriate circuit card to an available and appropriate receptacle on a motherboard of the computer. Typically, such circuit cards are contained within the computer chassis. Certain circuit cards, such as fax modem circuit cards, require additional connections external to the computer chassis. Access to circuit cards for such external connections is generally provided via elongated circuit card slots or portals in the computer chassis typically located on the back side of the computer chassis. Such circuit cards are typically attached to the chassis via brackets, called printed circuit board brackets or PCB brackets, which attach to the circuit card slot frame and block the circuit card slots.

Computer chassis are often provided with extra circuit card slots to allow for easy expansion of the system through the addition of circuit cards. Such extra slots are not equipped with circuit cards when the computer is originally shipped and/or sold and, therefore, are empty or open. Unless they are blocked, empty slots allow the introduction of dust or other foreign matter into the computer chassis thereby potentially interfering with the performance and life span of the computer's internal circuitry. Such unblocked empty slots also allow the release of electromagnetic (EM) and radio frequency (RF) waves generated by the computer's internal circuitry. The Federal Communications Commission imposes limits on the amounts of EM and RF wave emissions allowed to be released from devices being sold and transported in and around the United States and, therefore, it is desirable to minimize such emissions.

It is known to provide blank brackets over such empty slots to block them. It should be kept in mind that, as is explained above, the non-empty slots are blocked by PCB brackets. However, as the internal circuitry of computers has advanced, both the blank brackets and the PCB brackets can be inadequate to block the EM and RF wave emissions. The inadequacy of the brackets is believed to be due to gaps between the brackets and the computer chassis.

A typical computer chassis slot frame 10, as is shown in FIG. 1, comprises a plurality of elongated circuit card slots 12 therethrough. Typically, the slots 12 of such a computer chassis slot frame will be covered with blank brackets 14 and/or PCB brackets 15 (one blank bracket 14 and one PCB bracket 15 are shown). For clarity's sake the PCB bracket 15 does not include a printed circuit board attached thereto. Also shown in FIG. 1, both the blank bracket 14 and the PCB bracket 15 are typically held to a computer chassis slot frame 10 in one of two ways. First, the slot frame 10 may include a hook 16 to hold a bracket to the slot frame at one end, see A in FIG. 1 (typically a screw is used to hold the bracket to the slot frame at the other end). Second, as is shown at B in FIG. 1, the bracket may include a tip 18 at one end which fits into an opening 20 in the slot frame 10. As is shown in FIGS. 2a–d, the tip 18 of the bracket may be bent. The benefit of having a bent tip 18 is to assist in the placement and positioning of the bracket, particularly, to assist in positioning the tip 18 in the opening 20 of the slot frame 10. Although blocking the slots 12 with brackets 14 and/or 15 has proven sufficient to block dust and other debris from entering the computer chassis, such brackets became inadequate to sufficiently block EM and RF wave emissions.

In an effort to more adequately block the EM and RF wave emissions, electrically conductive clip-on or adhesive-backed protrusions were typically hand applied onto the computer chassis around the circuit card slots to allow for better contact between the computer chassis and the brackets and to decrease the size of the gap (i.e. the length of the gap) between the slot frame and the brackets. However, individually installing such protrusions by hand onto the chassis was both time consuming and labor intensive and, therefore, economically inefficient and unfavorable.

In an effort to find an alternative to installing individual protrusions directly on the computer chassis, shielding panels having protrusions manufactured therein were introduced. Such shielding panels were designed to be positioned between the computer chassis and the brackets in a manner similar to how a gasket would be positioned. FIG. 3 shows a typical prior shielding panel 22 attached to a computer chassis slot frame 10. The shielding panel 22 is shown having protrusions 24 extending out of the plane of the shielding panel 22. FIGS. 4a and 4b show perspective views of typical shielding panels of the prior art, 22a and 22b respectively, having protrusions 24a and 24b respectively. Such shielding panels could be attached to a computer chassis quickly and easily thereby surrounding the slots with protrusions to provide the desirable contact between the computer chassis and the brackets. However, such shielding panels have introduced additional problems.

As is shown in FIGS. 3–5, a first problem is that typical prior shielding panels include tongues 26 to assist in the placement and positioning of the panels. However, as is shown in FIG. 5, such tongues may intrude into neighboring slots thereby potentially interfering with the positioning of neighboring panels and/or with access through those neighboring slots.

A second problem is also shown in FIG. 5, a gap 28 may be created between the shielding panel 22 and the computer chassis slot frame 10 at one end of the slots 12. Such a gap 28 may undesirably catch the tip 18 of bracket 14 or 15 (particularly if the bracket tip 18 is bent as described above and shown in FIGS. 2a–d) thereby interfering with the placement, positioning, and effectiveness of the brackets 14 and/or 15 and interfering with the ease and efficiency of assembling the computer.

A third problem is shown in FIGS. 6a and 6b, the protrusions 24a and 24b (shown in FIGS. 6a and 6b respectively) of the shielding panels 22 extend such that a bracket having an uneven edge may catch on the protrusions 24 when placement or removal of the bracket is attempted. This problem is particularly prevalent with the use of PCB brackets 15 because, as is shown in FIGS. 2c, 6a, and 6b, PCB brackets 15 typically have notches 30 along their edges where support arms 32 are located. The support arms enable attaching a printed circuit board 34 to the PCB bracket. The notches 30 may catch or snag on the protrusions 24 thereby making manipulation of the bracket difficult.

In an effort to combat this snag problem, protrusions 24b having bent ends 36, as shown in FIGS. 4b and 6b, were introduced. However, as is shown in FIG. 6b, protrusions 24b could still snag the bracket as the protrusion ends 36 extend above the surface of the shielding panel a distance which is larger than the thickness of the brackets, approximately 1–2 millimeters.

Prior shielding panels have not provided adequate solutions to any of these problems.

SUMMARY OF THE INVENTION

The present invention provides a shielding panel which affords solutions to the problems described above. The present shielding panel may be easily attached to a computer chassis slot frame to provide protrusions around circuit card slots in the slot frame. The protrusions of the present shielding panel improve contact between the computer chassis and a blank bracket or PCB bracket positioned over the slot and are designed so as to remedy the snag problem of prior shielding panels.

In addition, the design of the present shielding panel includes a tab which wraps around an edge of the circuit card slot to help place and hold the shielding panel in position. The inclusion of such a tab allows elimination of the tongue of prior panels and thereby eliminates the problem of the tongue potentially interfering with neighboring panels and/or neighboring slots.

The inclusion of such a tab also inhibits the formation of a gap between the shielding panel and the computer chassis slot frame and, therefore, deflects the tip of a PCB bracket or blank bracket from catching in such a gap and interfering with the placement, positioning, or effectiveness of the bracket or the ease or efficiency of assembling the computer.

Furthermore, the present shielding panel provides protrusions for providing contact between brackets and the computer chassis slot frame. The protrusions of the present invention are bent such that the protrusions extend above the surface of the shielding panel but the ends of the protrusions extend below the surface of the shielding panel or at least close enough to the surface of the shielding panel such that the protrusion ends substantially do not snag PCB brackets or blank brackets (i.e. the distance between the protrusion end and the surface of the shielding panel (approximately 0.3–0.5 millimeters) is smaller than the thickness of the brackets (approximately 1–2 millimeters)).

Accordingly it is a primary object of the present invention to provide an improved shielding panel.

It is an additional object of the present invention to provide a shielding panel for shielding circuit card slots on a computer chassis.

It is a further object of the present invention to provide a shielding panel for use with printed circuit board brackets and/or blank brackets to shield circuit card slots to reduce the leakage of electromagnetic waves and/or radio frequency waves through a computer chassis.

It is another object of the present invention to provide a shielding panel which does not intrude into neighboring slots and thereby does not interfere with access through those neighboring slots.

It is yet another object of the present invention to provide a shielding panel which substantially eliminates gaps between the shielding panel and the computer chassis into which the tip of a bracket may become engaged.

It is still another object of the present invention to provide a shielding panel which substantially prevents interference with the placement, positioning, and effectiveness of a bracket and interference with the ease and efficiency of assembling the computer both of which could be caused by the tip of a bracket becoming engaged with a gap between the shielding panel and the computer chassis.

It is yet an additional object of the present invention to provide a shielding panel which includes protrusions which substantially do not interfere with the placement or removal of PCB and blank brackets.

It is still an additional object of the present invention to provide a shielding panel which includes protrusions which include bent ends which do not extend above the surface of the shielding panel.

It is yet a further object of the present invention to provide a shielding panel which includes protrusions which include bent ends which do not extend above the surface of the shielding panel a distance which is larger than the thickness of PCB or blank brackets.

Other objects and features of the present invention will become apparent from consideration of the following description taken in conjunction with the accompanying drawings.

BRIEF DESCRIPTION OF THE DRAWINGS

FIG. 1 is a perspective view of a computer chassis slot frame showing a plurality of circuit card slots and showing a blank bracket covering one slot and a PCB bracket covering another slot.

FIG. 2a is a perspective view of a typical blank bracket with a bent tip.

FIG. 2b is a top view of a typical blank bracket with a bent tip.

FIG. 2c is a perspective view of a typical PCB bracket with a bent tip.

FIG. 2d is a top view of a typical PCB bracket with a bent tip.

FIG. 7 is a perspective view of the shielding panel of the present invention.

DETAILED DESCRIPTION OF THE PREFERRED EMBODIMENT

Figure 3:
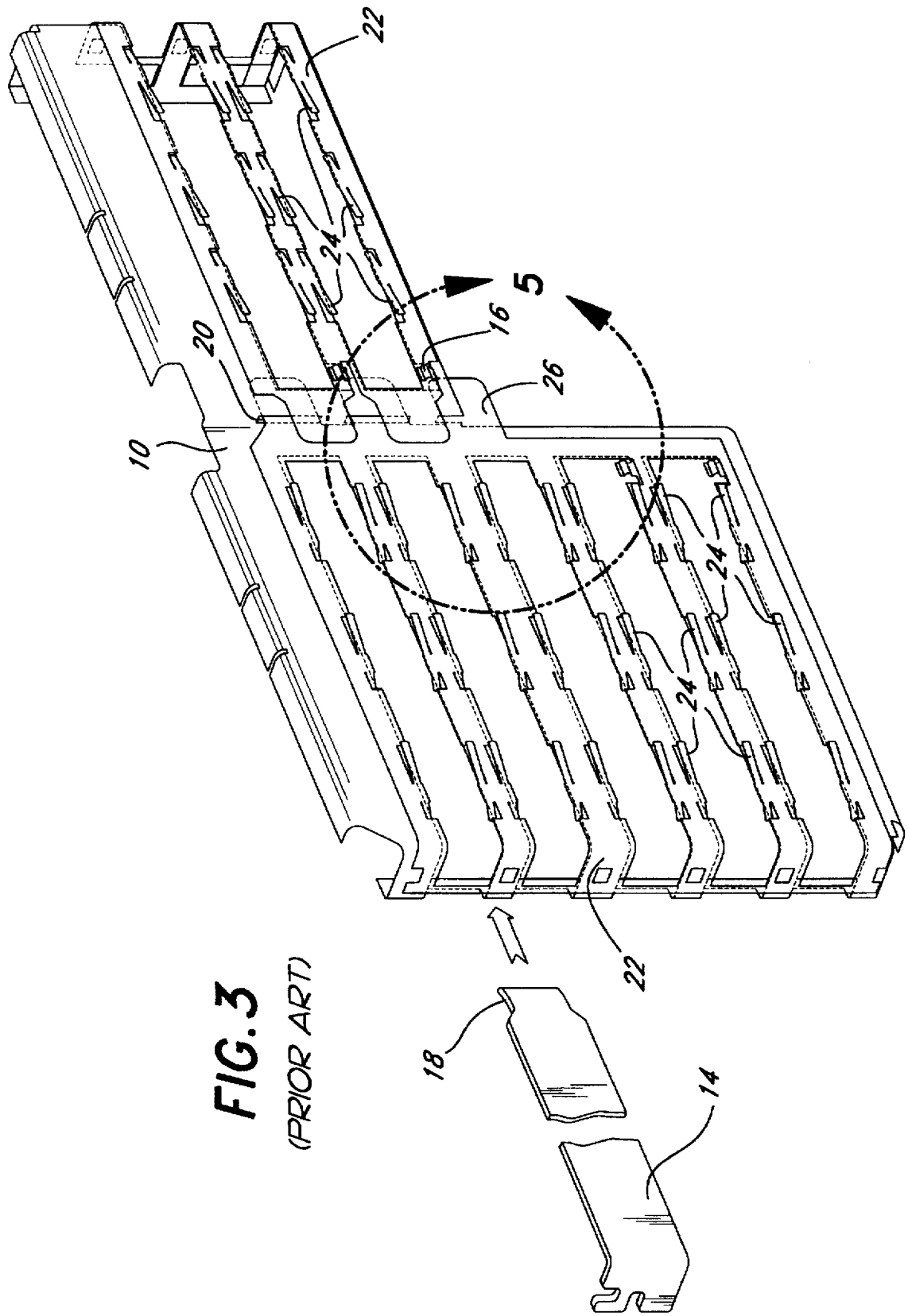
FIG. 3 is a perspective view of a prior shielding panel attached to a computer chassis slot frame.

Various views of preferred embodiments of the shielding panel 50 of the present invention are shown in FIGS. 7–11.

The present shielding panel 50 comprises a structure shaped to fit to a circuit card slot frame 10 of a computer chassis. The present shielding panel 50 is shaped to fit around and not interfere with access through at least one circuit card slot 12 of the slot frame 10. Although the present embodiment is shown and described as having a substantially rectangular shape and fitting around two circuit card slots 12, the shielding panel 50 of the present invention could be provided in a variety of shapes and sizes without departing from the scope of the present invention.

As is shown in FIGS. 7-11, the present invention comprises a shielding panel 50 having a substantially rectangular shape one end of which having a substantially ninety degree bend such that the panel 50 has an "L" shaped appearance from a top view. The panel 50 includes a substantially planar facing 52 through which are preferably two elongated access apertures 54. The shielding panel 50 is designed to be attached to the circuit card slot frame 10 of a computer chassis such that the facing 52 of the panel 50 fits around circuit card slots 12 in the frame 10 (i.e. the access apertures 54 correspond to and do not interfere with access through the slots 12).

As is described above, one purpose for using the shielding panel 50 is to provide improved contact between a computer chassis slot frame 10 and any blank brackets or PCB brackets attached thereto without substantially interfering with access through the slots 12 and/or assembly of the computer. Such improved contact in the present shielding panel 50 is due to the provision of small finger-like protrusions 56 on the facing 52 of the panel 50. The protrusions 56 are preferably positioned at locations proximate to and along the elongated access apertures 54. The protrusions 56 preferably protrude or extend out of the plane of the facing 52. The protrusions 56 will be described in greater detail below.

As is shown in FIGS. 7 and 9-11 and described above, the present shielding panel 50 includes elongated access apertures 54 which correspond to circuit card slots 12 in the computer chassis slot frame 10 to which the shielding panel 50 may be attached. The preferred embodiment shown in FIGS. 7 and 9-11, includes two such elongated access apertures 54. However, shielding panels 50 could provide only one or more such access apertures 54 and still fall within the scope of the present invention.

The preferred shielding panel 50 also includes a tab 58 positioned at one end of each elongated access aperture 54. The tab 58 is preferably bent such that it extends out of the plane of the facing 52. The tab 58, as shown in FIGS. 7-11, extends down out of the plane of the facing 52. The purpose for the tab 58 is to assist in the placement and positioning of the shielding panel 50 onto the computer chassis slot frame 10.

Figure 4B:
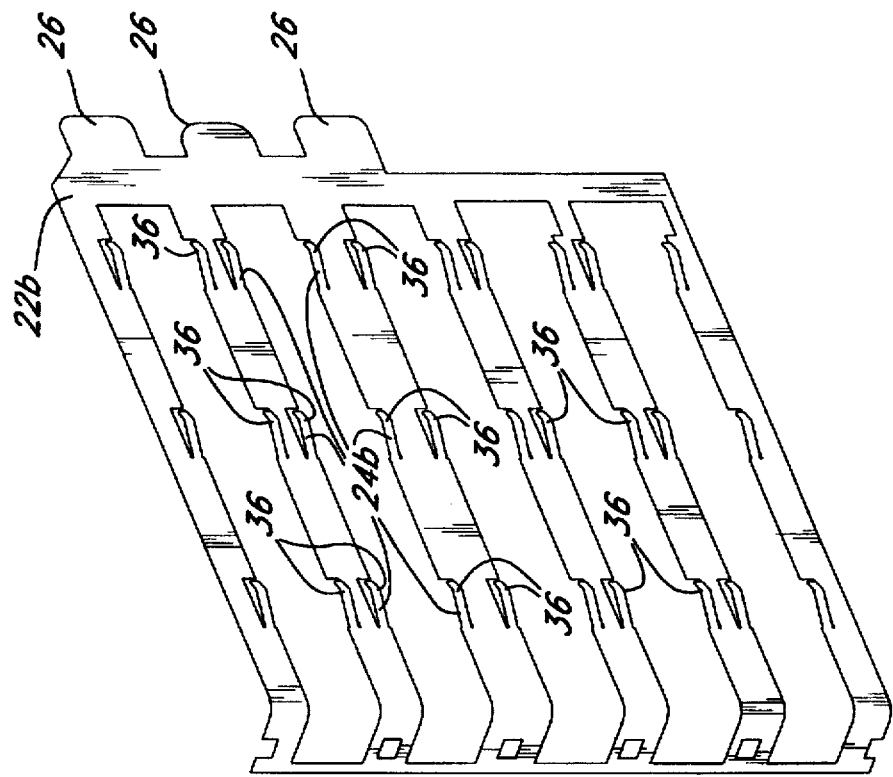
FIG. 4b is a perspective view of another prior shielding panel having protrusions thereon.
Figure 4A:
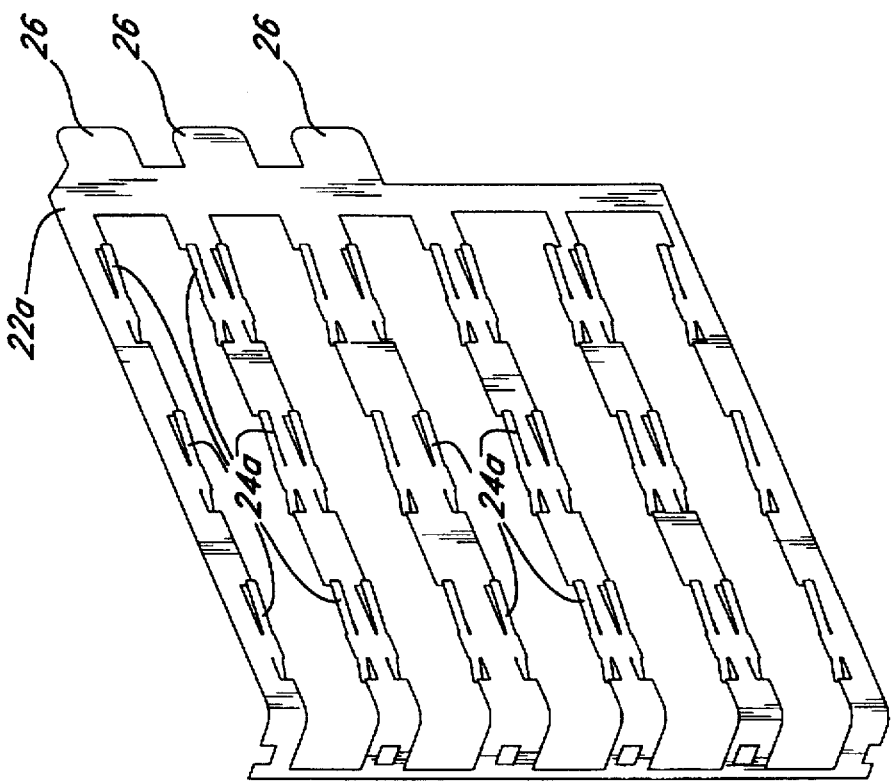
FIG. 4a is a perspective view of a prior shielding panel having protrusions thereon.
Figure 5:
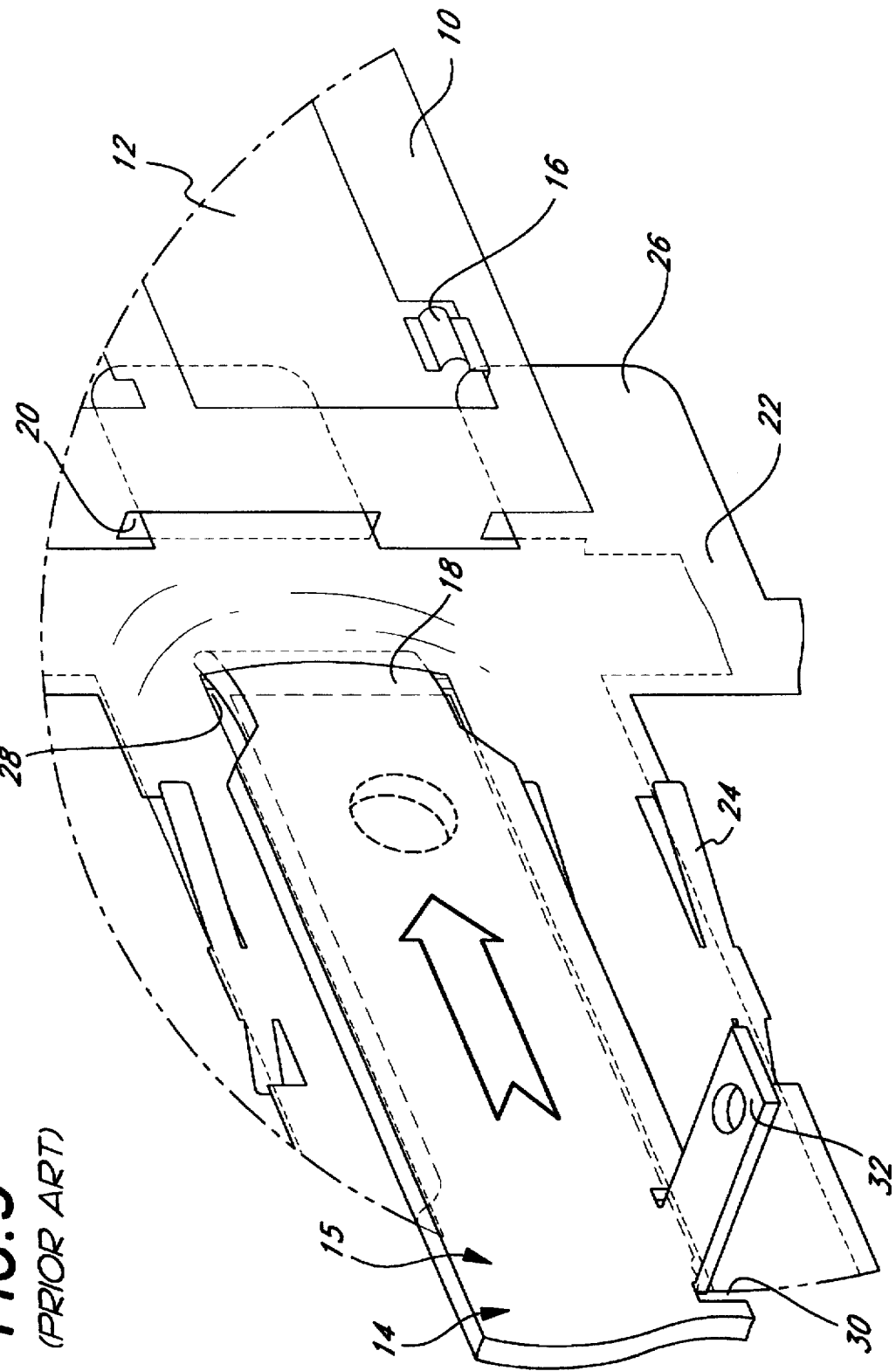
FIG. 5 is an enlarged view of a detail of FIG. 3 showing potential interference between a shielding panel tongue and a neighboring slot, and showing a bracket catching between the shielding panel and the slot frame.

The tab 58 eliminates the necessity of having a tongue 26 as in the prior shielding panels shown in FIGS. 3-5. In addition, the tab 58 substantially eliminates the possibility of the shielding panel 50 interfering with any neighboring shielding panel tongues and/or with access through any neighboring slot 12.

Figure 6A:
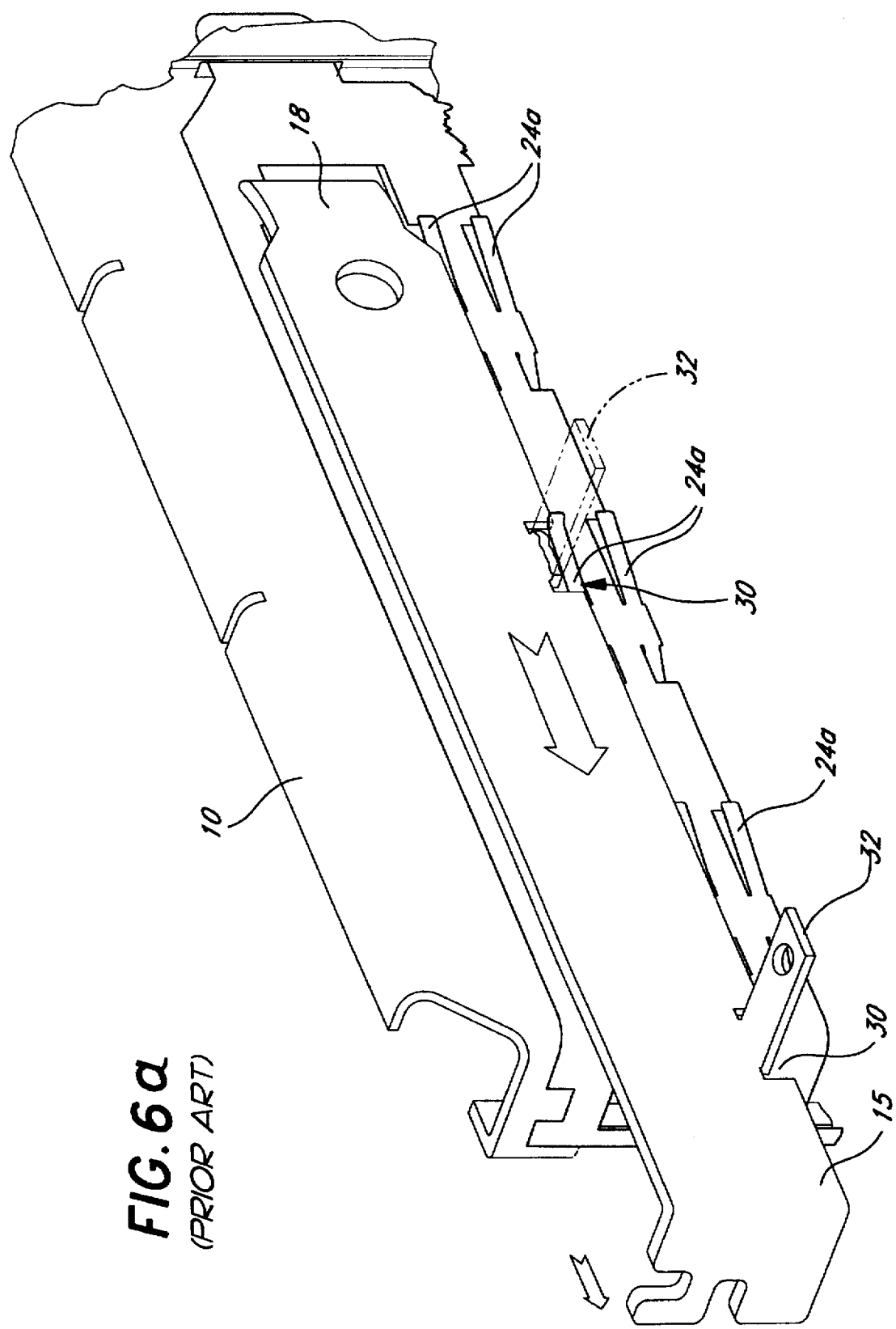
FIG. 6a is a perspective view of a bracket being removed from a slot frame and catching on protrusions of a prior shielding panel.
Figure 6B:
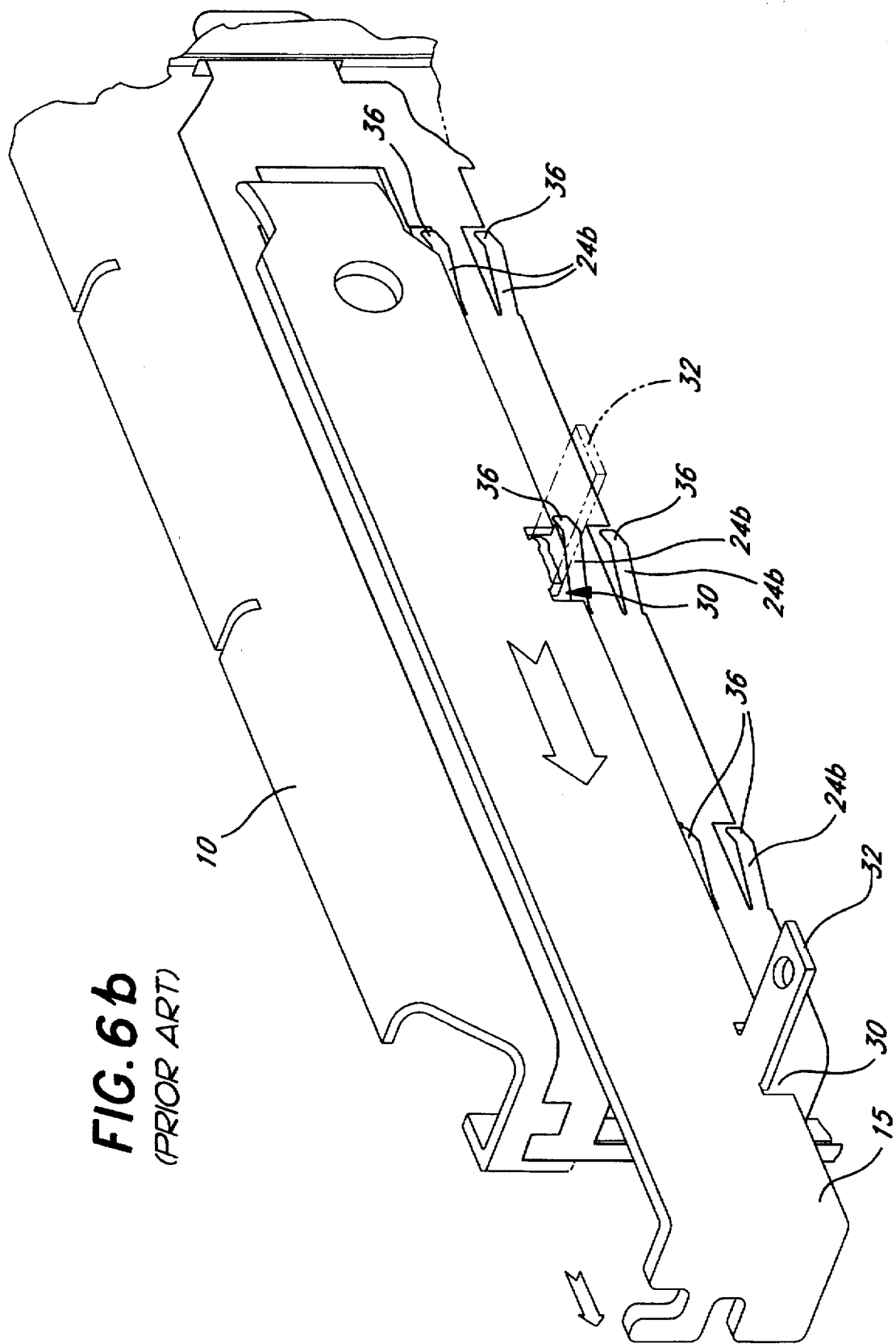
FIG. 6b is a perspective view of a bracket being removed from a slot frame and catching on protrusions of another prior shielding panel.
Figure 8A:
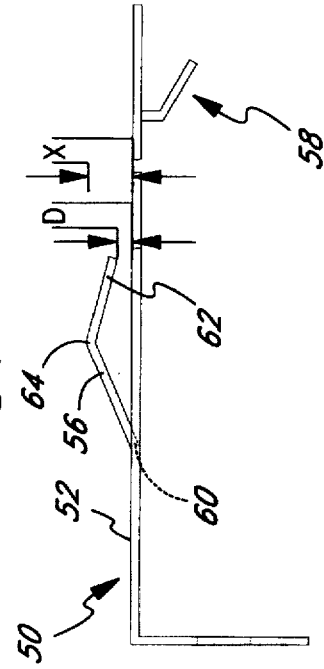
FIG. 8a is a top view of a first embodiment of the shielding panel of the present invention.
Figure 8B:
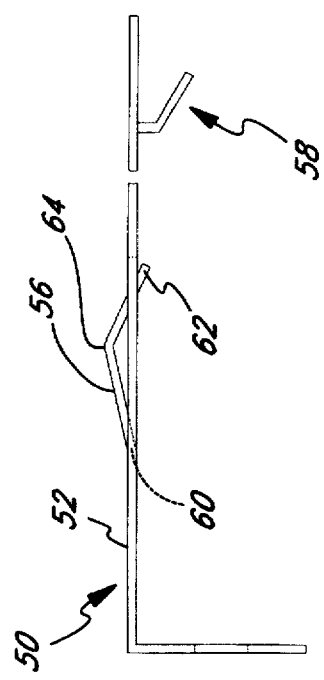
FIG. 8b is a top view of a second embodiment of the shielding panel of the present invention.
Figure 9:
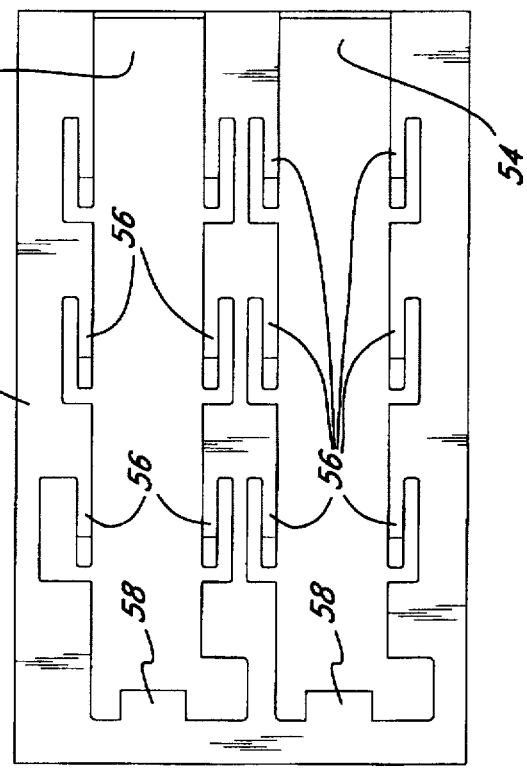
FIG. 9 is a side view of the shielding panel of the present invention.
Figure 10:
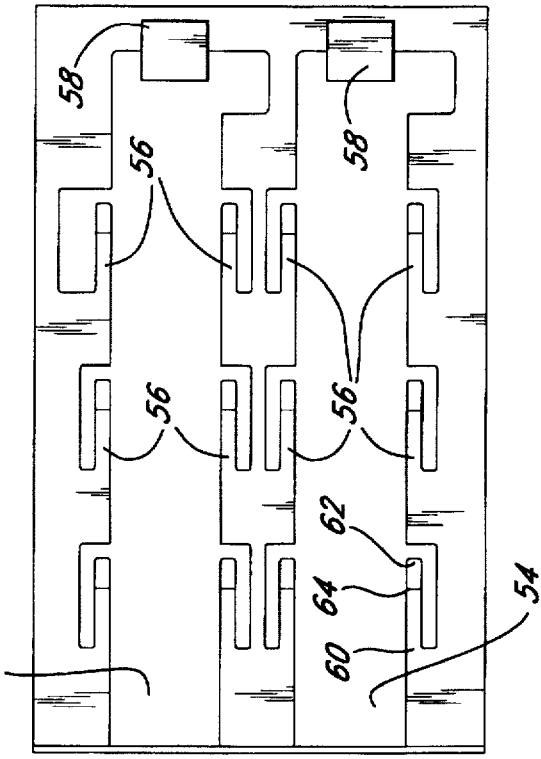
FIG. 10 is a side view of the shielding panel of the present invention opposite the view shown in FIG. 9.
Figure 11:
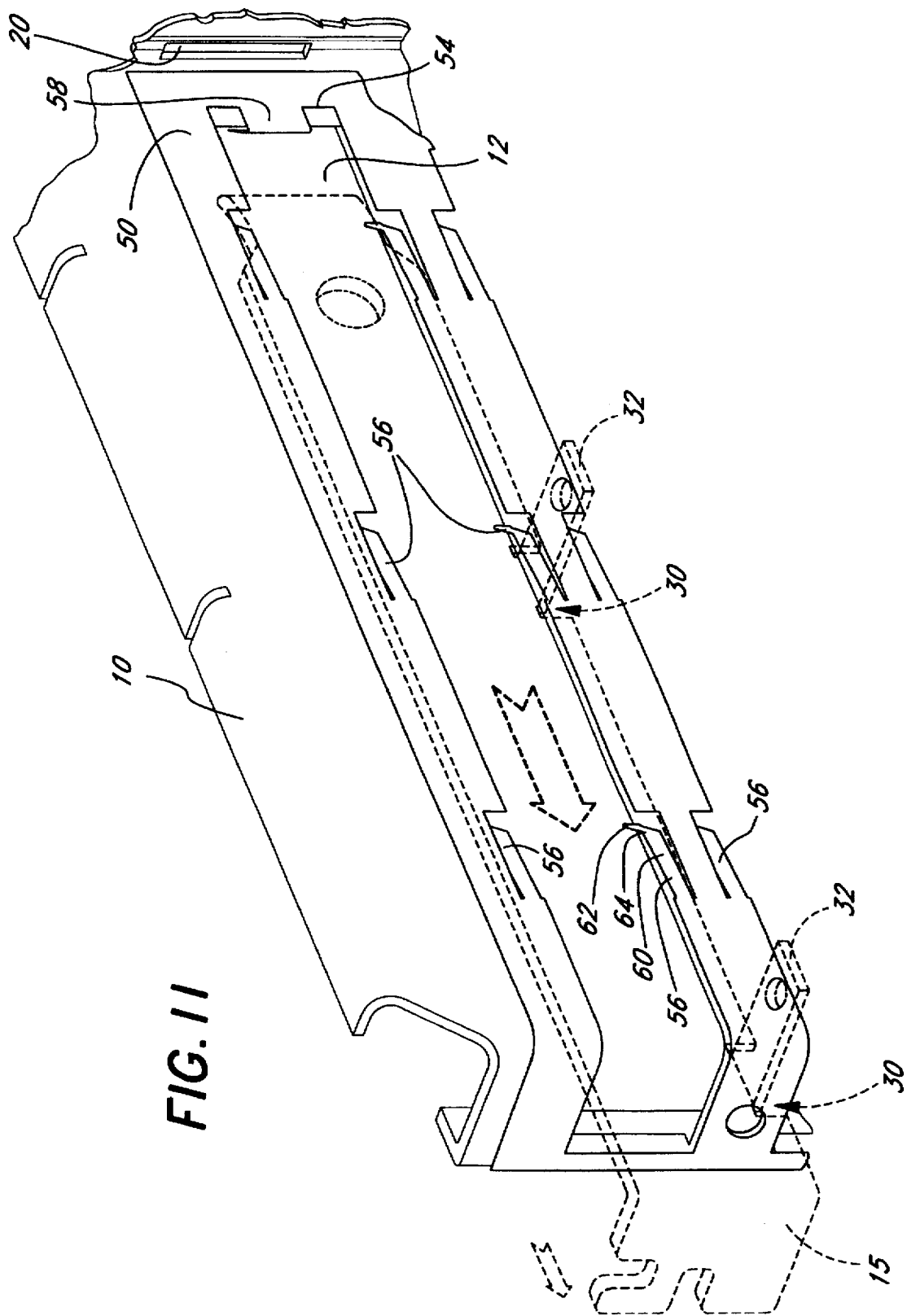
FIG. 11 is a perspective view of a bracket being removed from a slot frame and gliding over the protrusions of the present shielding panel.

The protrusions 56, as shown in FIGS. 7-11, comprise substantially finger-like members attached to the shielding panel 50 at a base 60 and remaining unattached at an end 62. As is shown in FIGS. 8a and 8b, each protrusion 56 extends up out of the plane of the panel facing 52, but each protrusion 56 also includes a bend 64 such that the end 62 of each protrusion 56 extends down toward the plane of the panel 50. FIGS. 8a and 8b show alternative embodiments of the protrusions 56 of the present invention. As is shown in FIG. 8a, one embodiment includes protrusions 56 bent such that the ends 62 extend down towards the plane of the panel facing 52 and actually extend through that plane. The embodiment shown in FIG. 8b includes protrusions 56 bent such that the ends 62 extend down towards the plane of the panel facing 52 such that a distance D remains between the end 62 and the plane of the panel facing 52 wherein that distance D is smaller than the typical thickness of blank and PCB brackets shown as distance X. It is important that the distance D be smaller than the thickness X of a bracket so that the ends 62 do not catch or snag any notches 30 in a bracket. As is described above, FIGS. 6a and 6b show brackets 15 having notches 30 being removed from a computer slot frame 10 having prior shielding panels 22 which have protrusions 24a and 24b which catch on the notches 30 of the brackets 15. However, as is shown in FIG. 11, the protrusions 56 of the present invention 50 have ends 62 which do not catch in notches 30 of bracket 15.

The present shielding panel 50 allows for better contact between brackets 14 and/or 15 and a computer chassis slot frame 10 thereby more adequately blocking EM and RF wave emissions without introducing the potential interference, catching, and/or snagging problems of prior shielding panels.

While embodiments of the present invention have been shown and/or described, various modifications may be made without departing from the spirit and scope of the present invention, and all such modifications and equivalents are intended to be covered.

I claim:

1. A shielding panel attachable to a computer chassis slot frame, said shielding panel comprising a substantially planar facing having at least one aperture therethrough defining an aperture edge, a hooked tab along said at least one aperture edge, the hooked tab extending out of the plane of the facing for assisting in placing and attaching said shielding panel on a computer chassis slot frame and for deflecting objects from catching between said shielding panel and said computer chassis slot frame, and at least one finger-like protrusion appended to the facing proximate the aperture edge.

2. The shielding panel of claim 1 wherein said planar facing having a top surface and a bottom surface, and said at least one protrusion comprises a base, a body, and an end, wherein the body lies between the base and the end, and the base is proximate the facing, the body includes a bend extending out of the top surface of the facing, and the end extends out of the bottom surface of the facing.

3. The shielding panel of claim 1 wherein said at least one protrusion comprises a base, a body, and an end, the body lies between the base and the end, and the base is proximate the facing, the body includes a bend extending out of the top surface of the facing, and the end extends toward the top surface of the facing defining a space between the end and the top surface of the facing wherein the space comprises a distance less than approximately 1 millimeter.

4. A shielding panel attachable to a computer chassis slot frame, said shielding panel comprising a substantially planar facing having at least one aperture therethrough defining an aperture edge, said facing having a top surface and a bottom surface, at least one finger-like protrusion appended to the facing proximate the aperture edge, the protrusion comprising a base, a body, and an end, wherein the body lies between the base and the end, and the base is proximate the facing, the body includes a bend extending out of the top surface of the facing, and the end extends out of the bottom surface of the facing thereby substantially preventing objects from catching between the finger-like protrusion and the top surface of the facing, and a hooked tab along said at least one aperture edge, the tab extending out of the bottom surface of the facing for assisting in placing and attaching said shielding panel on a computer chassis slot frame and for deflecting objects from catching between said shielding panel and said computer chassis slot frame.

5. A shielding panel attachable to a computer chassis slot frame, said shielding panel comprising a substantially planar facing having at least one aperture therethrough defining an aperture edge, said facing having a top surface and a bottom surface, at least one finger-like protrusion appended to the facing proximate the aperture edge, the protrusion comprising a base, a body, and an end, wherein the body lies between the base and the end, and the base is proximate the facing, the body includes a bend extending out of the top surface of the facing, and the end extends toward the top surface of the facing defining a space between the end and the facing wherein the space comprises a distance less than approximately 1 millimeter thereby substantially preventing objects from catching between the finger-like protrusion and the top surface of the facing, and a hooked tab along said at least one aperture edge, the tab extending out of the bottom surface of the facing for assisting in placing and attaching said shielding panel on a computer chassis slot frame and for deflecting objects from catching between said shielding panel and said computer chassis slot frame.

6. A shielding panel attachable to a computer chassis slot frame, said shielding panel comprising a substantially planar facing having at least one aperture therethrough defining an aperture edge, said facing having a top surface and a bottom surface, a hooked tab along said at least one aperture edge, the tab extending out of the bottom surface of the facing for assisting in placing and attaching said shielding panel on a computer chassis slot frame and for deflecting objects from catching between said shielding panel and said computer chassis slot frame, and at least one finger-like protrusion appended to the facing proximate the aperture edge, the protrusion comprising a base, a body, and an end, wherein the body lies between the base and the end, and the base is proximate the facing, the body includes a bend extending out of the top surface of the facing, and the end extends out of the bottom surface of the facing thereby substantially preventing objects from catching between the finger-like protrusion and the top surface of the facing.

7. A shielding panel attachable to a computer chassis slot frame, said shielding panel comprising a substantially planar facing having at least one aperture therethrough defining an aperture edge, said facing having a top surface and a bottom surface, a hooked tab along said at least one aperture edge, the tab extending out of the bottom surface of the facing for assisting in placing and attaching said shielding panel on a computer chassis slot frame and for deflecting objects from catching between said shielding panel and said computer chassis slot frame, and at least one finger-like protrusion appended to the facing proximate the aperture edge, the protrusion comprising a base, a body, and an end, wherein the body lies between the base and the end, and the base is proximate the facing, the body includes a bend extending out of the top surface of the facing, and the end extends toward the top surface of the facing defining a space between the end and the facing wherein the space comprises a distance less than approximately 1 millimeter thereby substantially preventing objects from catching between the finger-like protrusion and the top surface of the facing.

* * * * *